(12) United States Patent
Chen et al.

(10) Patent No.: US 7,045,873 B2
(45) Date of Patent: May 16, 2006

(54) DYNAMIC THRESHOLD VOLTAGE MOSFET ON SOI

(75) Inventors: Xiangdong Chen, Poughquag, NY (US); Dureseti Chidambarrao, Weston, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 10/728,750

(22) Filed: Dec. 8, 2003

(65) Prior Publication Data

US 2005/0121699 A1    Jun. 9, 2005

(51) Int. Cl.
*H01L 29/00* (2006.01)

(52) U.S. Cl. .................. 257/510; 257/382
(58) Field of Classification Search ............. 257/247, 257/348, 386, 510; 307/130; 327/534
See application file for complete search history.

(56) References Cited

U.S. PATENT DOCUMENTS 5,008,723 A * 4/1991 van der Have ............ 257/386
5,689,144 A * 11/1997 Williams ................... 307/130
6,504,226 B1 * 1/2003 Bryant ...................... 257/510
6,627,952 B1 * 9/2003 Wollesen ................... 257/347
6,628,160 B1 * 9/2003 Lin et al. .................. 327/534
2003/0052373 A1 * 3/2003 Hayashi et al. ............ 257/382

* cited by examiner

*Primary Examiner*—David Nelms
*Assistant Examiner*—Dao H. Nguyen
(74) *Attorney, Agent, or Firm*—Whitham, Curtis, Christofferson & Cook, PC; Joseph P. Abate (57) ABSTRACT

Provision of a body control contact adjacent a transistor and between the transistor and a contact to the substrate or well in which the transistor is formed allows connection and disconnection of the substrate of the transistor to and from a zero (ground) or substantially arbitrary low voltage in accordance with control signals applied to the gate of the transistor to cause the transistor to exhibit a variable threshold which maintains good performance at low supply voltages and reduces power consumption/dissipation which is particularly advantageous in portable electronic devices. Floating body effects (when the transistor substrate in disconnected from a voltage source in the "on" state) are avoided since the substrate is discharged when the transistor is switched to the "off" state. The transistor configuration can be employed with both n-type and p-type transistors which may be in complementary pairs.

20 Claims, 6 Drawing Sheets

PRIOR ART

DYNAMIC THRESHOLD VOLTAGE MOSFET ON SOI

BACKGROUND OF THE INVENTION

1. Field of the Invention

The present invention generally relates to the design and fabrication of transistors suitable for high density integration and, more particularly, to transistors capable of high performance even when operated at reduced voltages, such as in integrated circuits for portable devices.

2. Description of the Prior Art

The possibility of increased chip functionality and performance and economy of manufacture of integrated circuits has provided substantial pressure toward higher integration density of integrated circuits. By the same token, greater chip functionality has also led to the development of many portable devices of small size such as so-called personal digital assistants, portable telephones with enhanced (e.g. video) functions and the like. However, portable devices must have power supplies which do not significantly compromise the quality of portability, such as by the size and/or weight of batteries. Therefore, a severe constraint is placed on power consumption of the integrated circuits and the transistors therein to provide adequate periods of service of the portable devices between battery replacement or recharging.

Even in non-portable devices, increased integration density is accompanied by increased power dissipation density. Even though power dissipated by a single transistor may seem quite small, the power consumption or dissipation per unit of chip area increases with integration density. Moreover, power dissipation per transistor increases with switching frequency/clock rate; increased clock rate being a major incentive for increased integration density by reduction of signal propagation path length as well as reduced noise susceptibility.

The most common approach to reduction of power consumption has been to scale power supplies to lower voltages while maintaining sufficient voltage overdrive capability to maintain acceptable switching speed of transistors. In particular, while field effect transistors (e.g. MOSFETs) have become the technology of choice for all but the highest switching speeds, the transition time between "on" and "off" states, sometimes referred to as the slew rate, is severely degraded as power supply voltage is reduced; largely because of the capacitive load presented by field effect transistor gates. While field effect transistors can be designed to operate satisfactorily at voltages which are somewhat reduced, they cannot be scaled to lower voltages as readily as power supplies. In particular, the threshold voltage cannot be scaled by the same amount as power supply voltage because of sub-threshold leakage and the low limit for the sub-threshold output voltage swing. Additionally, scaling of MOSFETs may cause them to be more delicate and susceptible to damage from breakdown due to static charge, coupled noise and the like. Accordingly, it is an extreme challenge to scale the power supply voltage, improve the circuit speed and limit the leakage current simultaneously.

Figure 1:
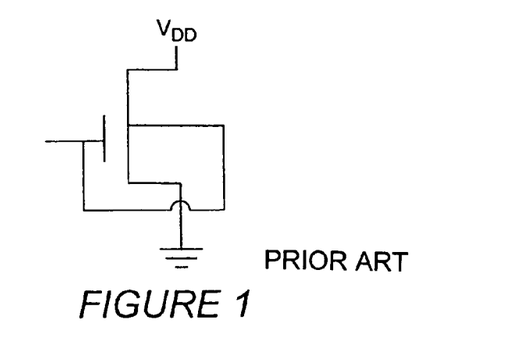
FIG. 1 is a schematic diagram of the transistor disclosed in U.S. Pat. No. 5,559,368.

Dynamic threshold voltage MOSFETs (DTMOSFETs) are known and an exemplary design is disclosed in U.S. Pat. No. 5,559,368. A schematic depiction of this transistor is illustrated in FIG. 1. This transistor design seeks to maintain high performance at reduced power supply voltage by connecting the gate of the transistor to the silicon well in which the transistor is formed and can achieve a high drive current in the "on" state as well as low "off" state leakage current. In the "off" state, $V_{gs}=V_{bs}=0V$ and the transistor has a high threshold. In the "on" state, $V_{gs}=V_{ds}=V_{bs}$ and has a low threshold because gate voltage is applied to the body of the transistor. However, the principal disadvantage of this transistor design is that because gate bias is applied to the transistor body, the leakage current of the forward biased p-n junction at the source increases dramatically when the power supply voltage is greater than 0.7 V; effectively limiting the power supply voltage to that value; a value which increases noise susceptibility and does not support sufficient voltage overdrive for optimal or potential switching speed.

SUMMARY OF THE INVENTION

It is therefore an object of the present invention to provide a transistor structure capable of high performance at low power supply voltages.

It is another object of the invention to provide a transistor structure which is robust, capable of economical manufacture and in which power supply voltage is not critical to leakage current effects.

In order to accomplish these and other objects of the invention, a transistor suitable for use in an integrated circuit, particularly for a portable electronic device is provided including a transistor portion comprising a source, drain and gate formed in a semiconductor layer of a first conductivity type, a contact to the semiconductor layer, and a body control contact of a conductivity type opposite the first conductivity type and interposed between the gate and the substrate contact.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
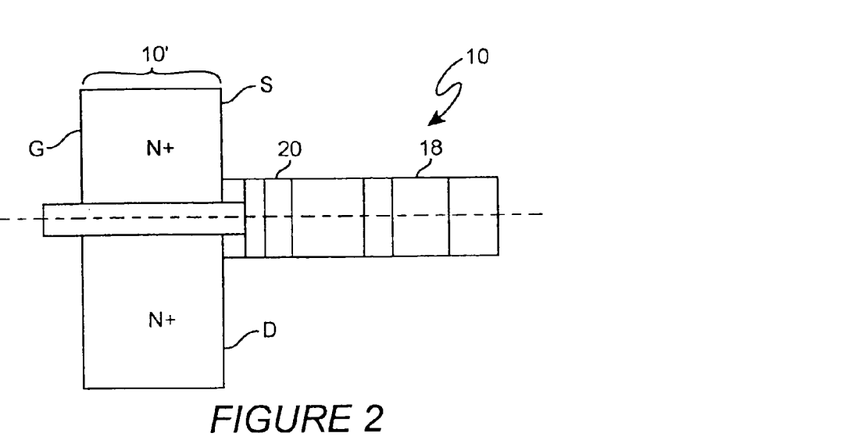
FIG. 2 and FIG. 3 are plan and cross-sectional views, respectively, of a transistor in accordance with the invention.
Figure 3:
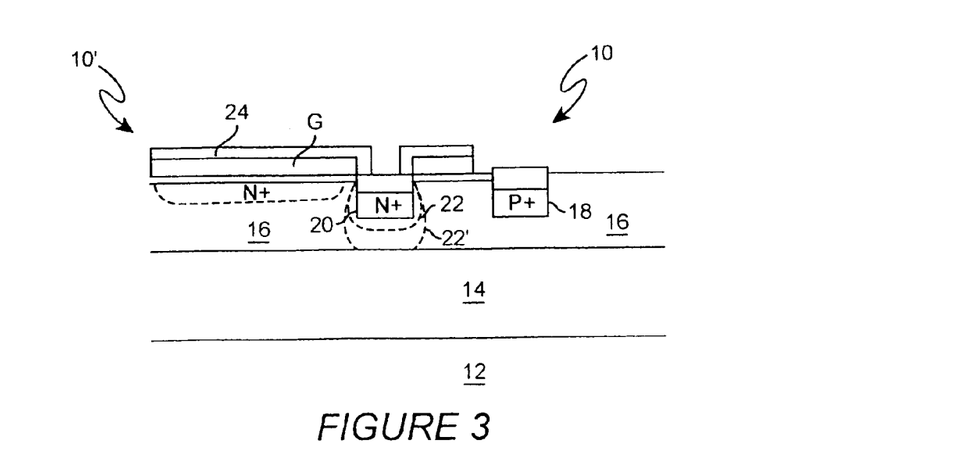

Referring now to the drawings, and more particularly to FIG. 2 and FIG. 3, plan and cross-sectional views of a DTMOSFET in accordance with the invention is shown. While a NMOS transistor is shown, it is to be understood that the principles of the invention are equally applicable to PMOS devices simply by reversing the conductivity types of the illustrated regions. It should also be appreciated that the principles of the invention and the implementation thereof is completely independent of the design of the remainder of the transistor and performance enhancing structures such as halo and extension implants can be designed and implemented freely, consistent with the practice of the invention. Therefore, such possible structures which are not important to the practice of the invention are to be considered as represented in the simplified form of the source S and drain D illustrated in the Figures.

The transistor in accordance with the invention is preferably formed on a silicon-on-insulator substrate comprising a thick handling substrate 12, an insulator 14 (generally oxide and referred to as a buried oxide (BOX) layer) and a relatively thin, high-quality monocrystalline semiconductor layer (in this case of p-type), generally silicon. However, it should be understood that the basic principles of the invention are also applicable to other semiconductor or substrate structures, such as SiGe or GaAs. As illustrated, the field effect transistor portion 10', itself, of the DTMOSFET is positioned at the left side of FIG. 2 and FIG. 3 and in FIG. 3 the source and drain regions (S/D) are positioned one in front of (or behind) the other with the conduction channel extending in a direction perpendicular to the plane of the page.

The transistor in accordance with the invention differs from embodiments of the prior art design schematically illustrated in FIG. 1 in the placement of the p-well contact 18 possibly more remote from the transistor and formation of an N+ region 20 in the p-well or layer 16 which is also preferably connected to the gate, G, of the transistor by gate connection 24 at a location between the p-well connection structure 18 (in this case, of P+ semiconductor material) and that the p-well connection can be connected to a substantially arbitrary zero (ground) or low voltage opposite in polarity to that applied to the transistor (e.g. negative) to facilitate discharge of the floating body when the transistor is switched off.

The N+ region 20 functions as a gate to the body control contact; in effect, forming a pass transistor between p-well FET portion 10' (collectively functioning as a S/D) and the p-well contact. The N+ region causes a depletion region 22 between the N+ region (connected to the gate, G, and the p-well. However, silicon body 16 is thick enough to avoid the N+ region causing full depletion over the full depth of the p-well layer when the transistor 10' is in the off-state. That is, when transistor portion 10' is in the off-state, the gate, G, is at ground and the depletion region 22 between the N+ region 20 and the BOX layer 14 does not reach or merge with the BOX layer and the p-well below the gate, G, is connected to the p-well contact 18 through the region below the N+ ("gate") region 20. In the on-state, however, the body control contact 20 is also applied with gate bias (or similar positive voltage which can be derived and applied through a connection other than a direct connection to the gate, although the latter is much preferred) and the depletion region 22 expands, as illustrated at 22' to merge with the BOX layer 14 and the p-well under the transistor portion 10' is disconnected from the p-well contact and thus floats. Compared with the off-state, the threshold voltage Vt is reduced in this state. The transistor can also thus have more gate overdrive (due to the reduced threshold voltage) and the drive current and switching speed is thus improved.

Therefore, the DTMOSFET in accordance with the invention has the following advantages:

1.) The transistor can have a high threshold in the off-state and a low threshold in the on-state to produce a high Ion and low Ioff and improved on/off current ratio.

2.) The power supply voltage can be scaled down due to the low threshold in the on-state and power consumption/dissipation can be reduced.

3.) There is no floating body effect in the transistor even though "gate" 20 disconnects the transistor portion channel from the p-well contact. (In the on-state the transistor has a floating p-well and the body can rise to the same potential as the source voltage. For the partially depleted SOI MOSFET, the floating body potential depends on how recently the and how often the transistor has been switched through its high impact ionization condition. However, with the transistor structure in accordance with the invention, the p-well is connected to the p-well contact 18 in the off-state and the charge stored in the p-well is easily removed.)

4. Unlike the prior DTMOSFET of FIG. 1, the gate of transistor portion is not directly connected to the p-well contact and there is no forward p-n junction leakage or criticality of power supply voltage that can cause increased leakage.

Accordingly, it is seen that the transistor in accordance with the invention provides high-performance operation at potentially deeply scaled power supply voltages and thus provides much reduced power consumption/dissipation without compromise of performance or operating margins. Further, the "footprint" or required area of the transistor in accordance with the invention need be only slightly larger than the transistor portion 10' and thus there is little, if any, penalty in integration density to obtain the above benefits. Further, little additional process complexity is required to produce the transistor in accordance with the invention and the few additional processes have relatively relaxed overlay tolerances, as will be apparent from the discussion of a suitable exemplary manufacturing process below.

Figure 4A:
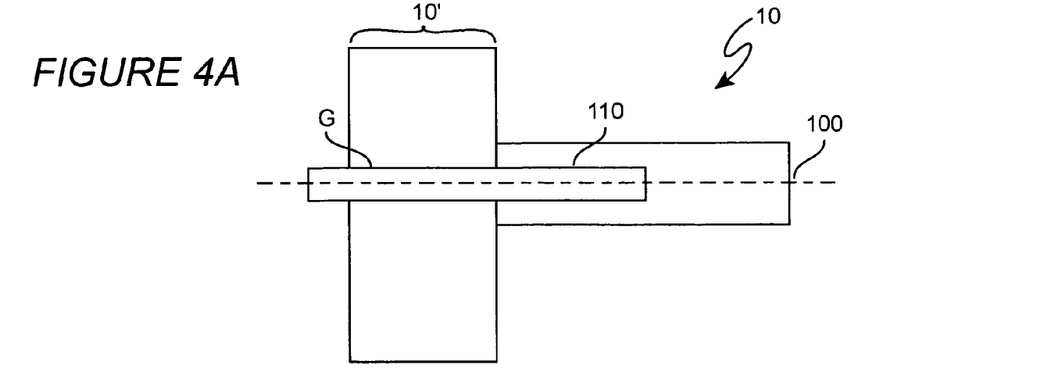
FIGS. 4A, 5A, 6A, 7A, 8A, 9A, 10A, and 11A are plan views of stages of manufacture of the transistor of FIG. 2 and FIG. 3, FIGS. 4B, 5B, 6B, 7B, 8B, 9B, 10B, and 11B are cross-sectional views of stages of manufacture of the transistor of FIG. 2 and FIG. 3 and respectively corresponding to FIGS. 4A–11A.
Figure 4B:
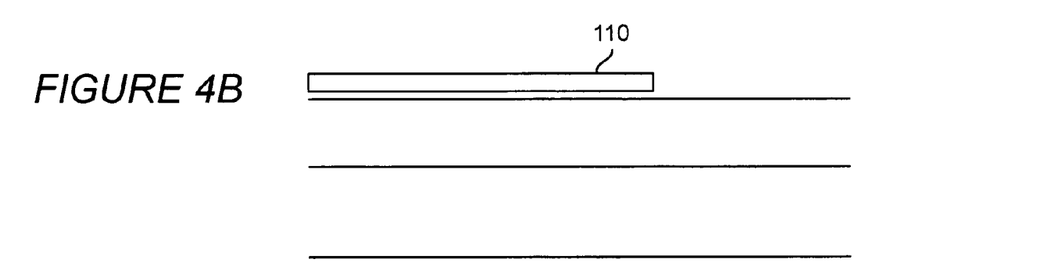
Figure 5A:
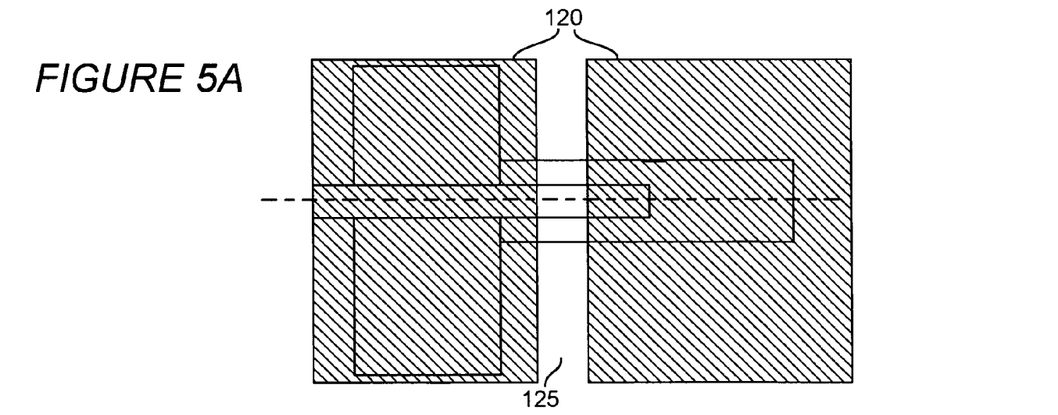
Figure 5B:
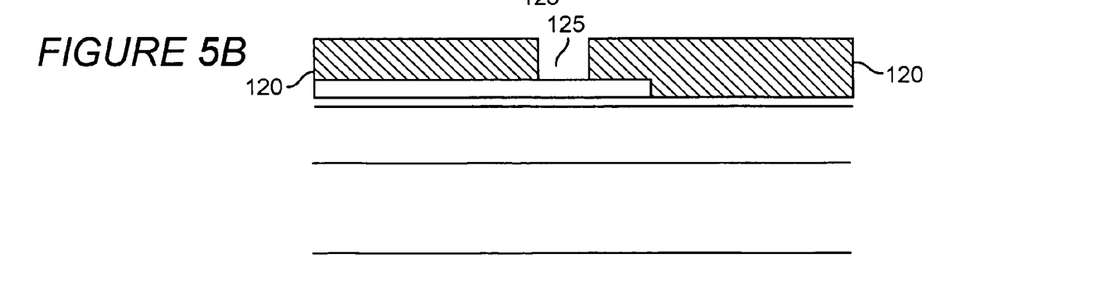
Figure 6A:
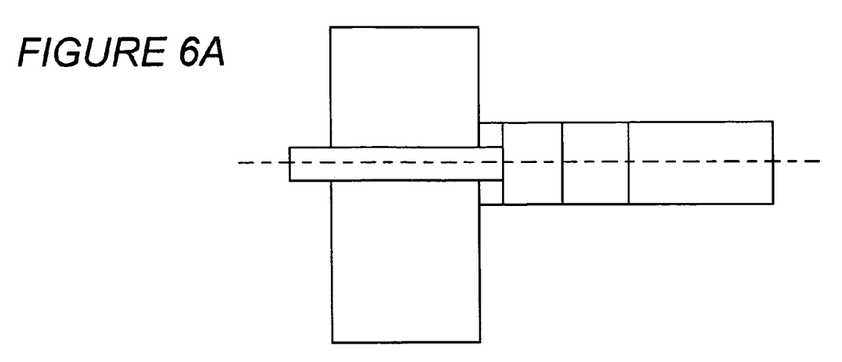
Figure 6B:
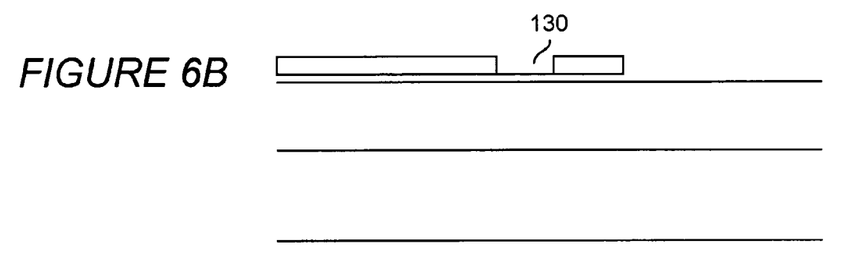

Referring now to FIGS. 4A and 4B, an initial stage in formation of a DTMOSFET is shown. The overall area of the DTMOSFET is indicated by outline 100. In regard to transistor portion 10' this stage of manufacture may be subsequent to gate patterning, spacer formation and S/D, and/or halo implantation or may be performed on a prepared substrate and the gate formed and patterned in connection with the step illustrated and implantations performed subsequently. In some cases, it is the practice to remove and replace the gate structure after the implantations are performed and this stage of manufacture can be accommodated and considered to be represented in FIGS. 4A and 4B. In any case, a layer of polysilicon is deposited and patterned (e.g. lithographically by any known process) to form or contact the gate structure which extends laterally of the transistor, as indicated by reference numeral 110. Then, as shown in FIGS. 5A and 5B, a resist layer 120 is applied and patterned at 125 at the location where the "gate" or body control contact 20 is to be formed. The polysilicon is then etched by a suitable process such as reactive ion etching (RIE) at that location 130 and the resist removed, as shown at FIGS. 6A and 6B.

Figure 7A:
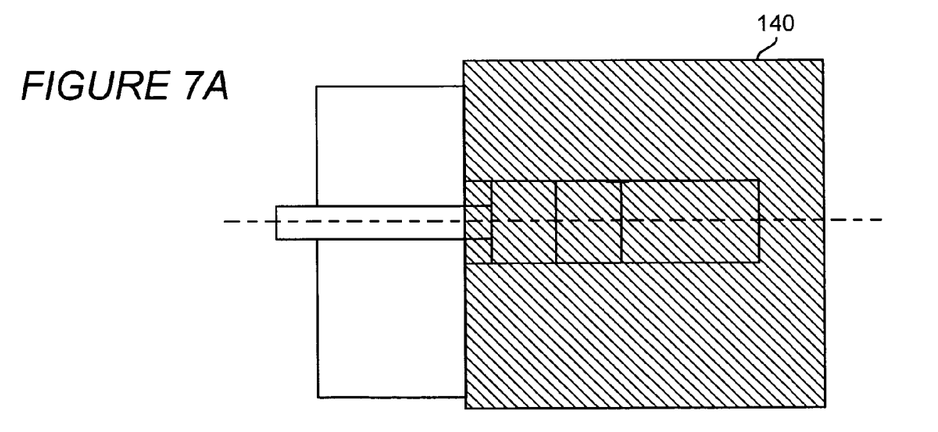
Figure 7B:
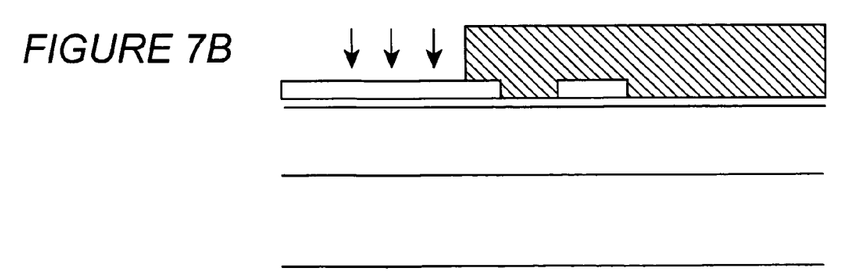

FIGS. 7A and 7B show application and patterning of a further resist layer 140 for the source and drain (S/D) implants, extension implants and/or halo implants 145 interspersed with formation and/or removal of sidewall spacers to control location of the implants in any of a number of known manners that may be appropriate to different transistor designs, if not performed earlier, as noted in regard to FIGS. 4A and 4B.

Figure 8A:
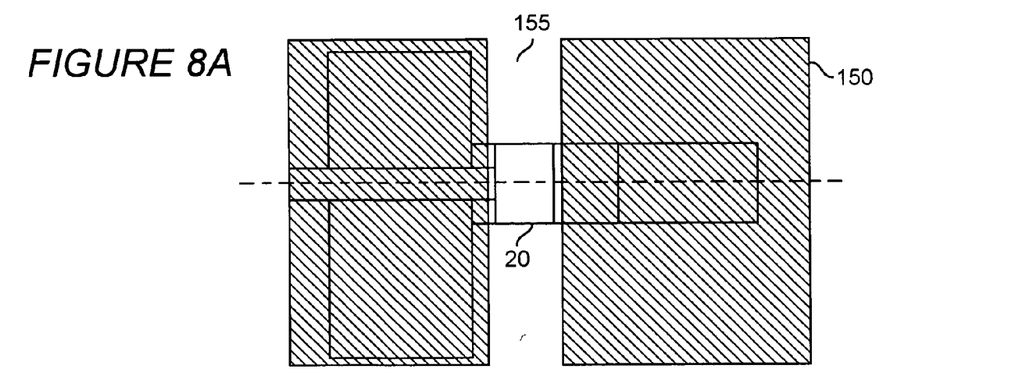
Figure 8B:
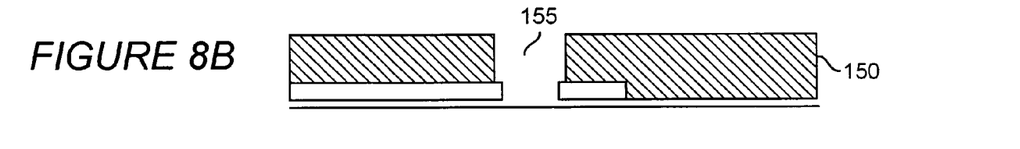

While the process step shown in FIGS. 7A and 7B may not be necessary if previously performed, FIGS. 8A and 8B show application and patterning of a further resist layer 150 for location (155) and formation of the body control contact region 20. This region 20 may be formed by etching a trough and depositing N+ doped silicon or, preferably, by simply implanting N-type impurities to a depth which is a significant fraction of the SOI layer depth and which is, to a degree, dependent on the intended voltages and operating margins of the transistor. For example, where the transistor is to be operated at about 1V, the p-well below N+ region 20 is preferably doped at about $1 \times 10^{18}/cm^3$. The silicon body thickness 16 is preferably about 800 Å and the depth of n+ region 20 can be from 300–350 Å, as shown in FIGS. 9A and 9B.

Figure 9A:
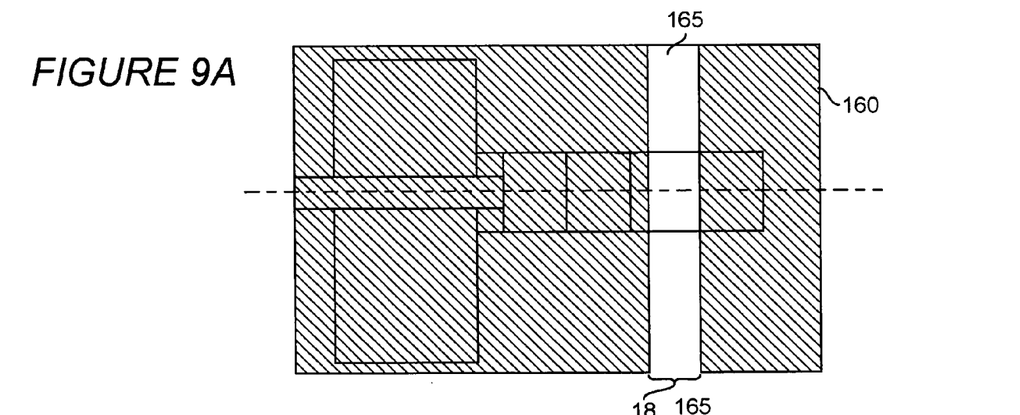
Figure 9B:
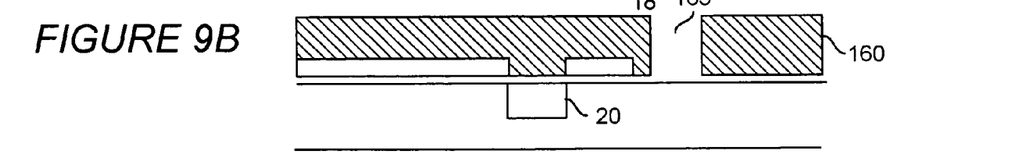
Figure 10A:
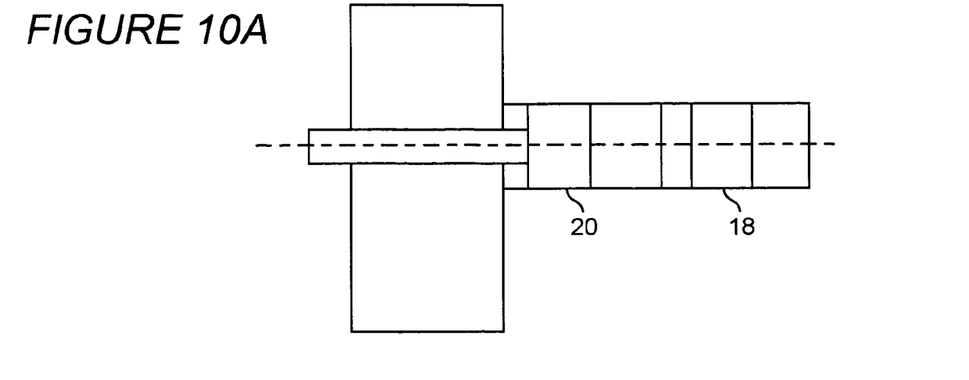
Figure 10B:
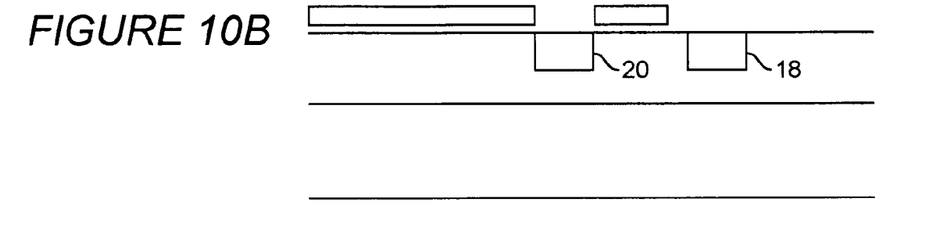
Figure 11A:
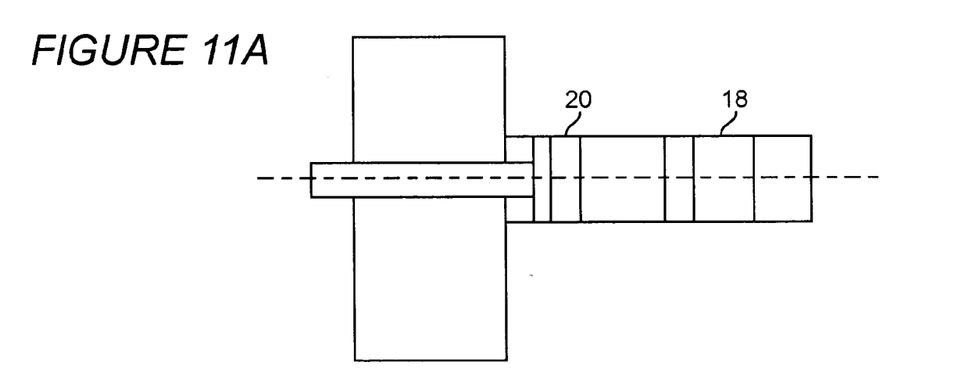
Figure 11B:
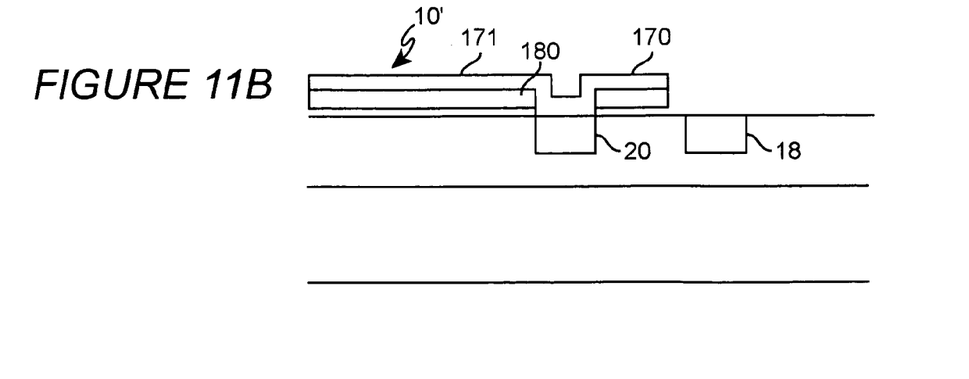

FIGS. 9A and 9B also show removal of resist 150 and application and patterning of resist 160 to locate (165) and form the well contact region 18 by a process similar to that described above in regard to FIGS. 8A and 8B. (The term "well contact" will be used as a convenient reference to structure 18 even if no impurity "well", as such, is provided and the semiconductor is of uniform impurity type. The term "body contact" may be used hereinafter, as well, to refer to the same structure, 18.) Either etching and deposition or implantation or a combination thereof may be used and results in the well contact region 18 as shown in FIGS. 10A and 10B. Then, to complete the transistor in accordance with the invention, contacts 170, 171 are formed, preferably of metal, connecting the body control contact 20 and the gate of the transistor portion 10'. Then, if desired, the transistor may be annealed to activate the implanted impurities (if not done earlier) and/or to form silicide 180 for reducing resistance of the gate, source and drain and body control and well contacts, as shown in FIGS. 11A and 11B.

Figure 12:
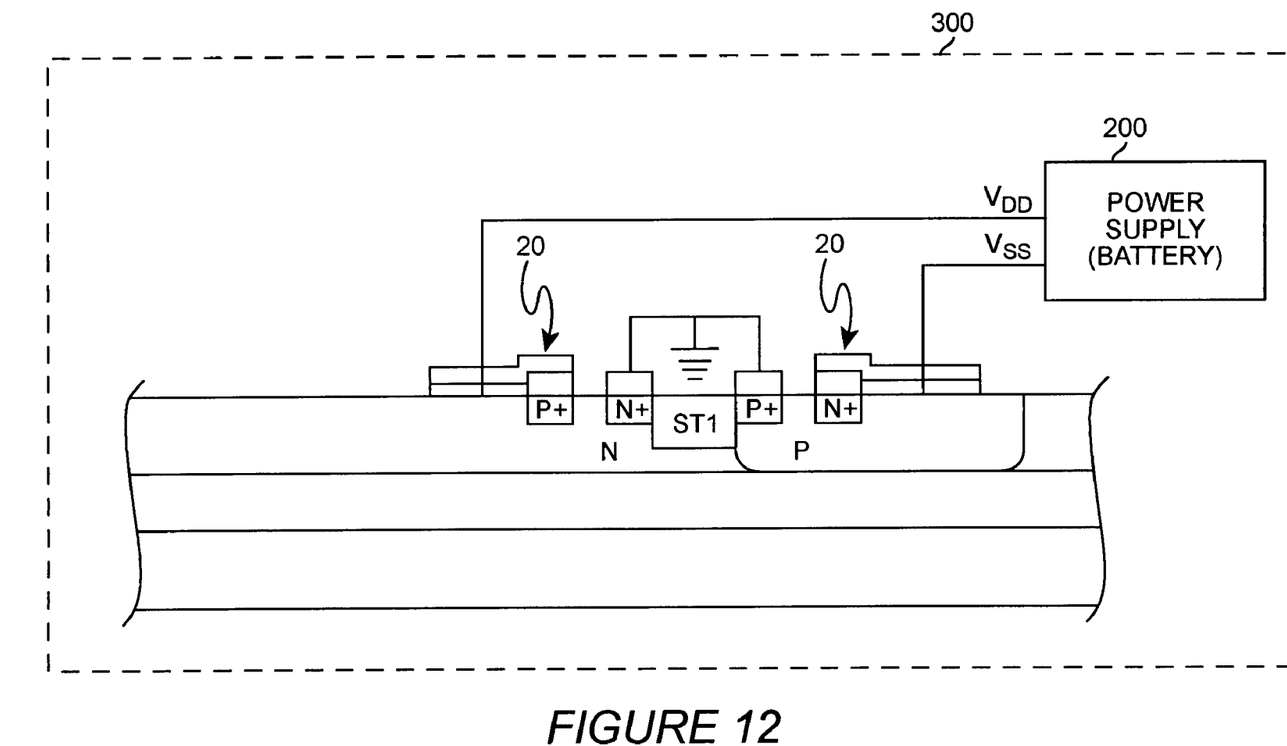
FIG. 12 illustrates an exemplary (e.g. CMOS) portion of an integrated circuit and power supply connection within a portable electronic device.

It should be appreciated that a single well contact can suffice for a plurality of transistors (including complementary pairs of transistors, such as CMOS, schematically illustrated in an exemplary form with a power supply 200 in a portable electronic device 300) in accordance with the invention if connected to a fixed voltage source. The transistors will not interact adversely due to the disconnection provided by body control contact or "gate" 20 when they are in different on or off states. Such formation of common well contacts can almost completely ameliorate any area penalty of the invention since only a small area is required for the well contact and the body control contacts may generally, depending on circuit design, remove the need for larger isolation structures for individual transistors.

In view of the foregoing, it is seen that the transistor having an advantageous variable threshold and reduced if not substantially eliminated leakage and, consequently, other advantageous properties can be formed with few additional process steps of low overlay accuracy (imposed only by integration density and isolation) as compared with relatively high power dissipation transistor designs (e.g. corresponding to transistor portion 10' only) and only duplicated contact processes as compared with the low power transistor design of FIG. 1 while completely eliminating its principal drawback and criticality.

It should also be understood that while formation of the transistor in accordance with the invention on a substrate where the depth of the semiconductor is limited, as in a SOI substrate, it is possible to practice the invention in regard to other structures by suitably configuring the geometry of the impurities in the semiconductor material in which the transistor is formed in connection with the geometry of the well contact 18 and the body control contact 20. The meritorious effects of the invention can be obtained to a substantial degree if the expanded depletion region in the on state suffices to increase body resistance by only a few orders of magnitude; which effect will also tend to reduce any floating body effects, discussed above, which are, in any event, substantially eliminated by the invention even though the transistor body will tend to float if fabricated on a SOI substrate or the like.

While the invention has been described in terms of a single preferred embodiment, those skilled in the art will recognize that the invention can be practiced with modification within the spirit and scope of the appended claims.

The invention claimed is:

1. A field effect transistor comprising
    a transistor portion comprising a source, drain and gate formed on or in a semiconductor layer of a first conductivity type,
    a body contact to said semiconductor layer, and
    a body control contact of a conductivity type opposite said first conductivity type and interposed between said gate and said body contact to function as a pass transistor gate between said transistor portion and said body contact.

2. A field effect transistor as recited in claim 1, further including
    a connection between said gate and said body control contact.

3. A field effect transistor as recited in claim 2, wherein said body contact to said semiconductor layer is a region of said first conductivity type.

4. A field effect transistor as recited in claim 1, wherein body said contact to said semiconductor layer is a region of said first conductivity type.

5. A field effect transistor as recited in claim 1, wherein said body contact to said semiconductor layer is connected to a low voltage opposite in polarity to a voltage applied to said field effect transistor.

6. A field effect transistor as recited in claim 1, wherein said semiconductor layer is formed on an insulator on a substrate.

7. A field effect transistor as recited in claim 1, wherein said semiconductor layer is a silicon layer of a silicon-on-insulator substrate.

8. A field effect transistor as recited in claim 1, wherein a thickness of said semiconductor layer is approximately 800 Å and said body control contact extends approximately 300 Å to 350 Å into said semiconductor layer.

9. An integrated circuit comprising
    a plurality of transistor portions comprising a source, drain and gate formed on or in a semiconductor layer of a first conductivity type,
    a body contact to said semiconductor layer, and
    a body control contact of a conductivity type opposite said first conductivity type and interposed between said gate and said body contact to function as a pass transistor gate between at least one of said transistor portions and said body contact.

10. An integrated circuit as recited in claim 9, further including
    a connection between said gate and said body control contact.

11. An integrated circuit as recited in claim 10, wherein said body contact to said semiconductor layer is a region of said first conductivity type.

12. An integrated circuit as recited in claim 9, wherein said body contact to said semiconductor layer is a region of said first conductivity type.

13. An integrated circuit as recited in claim 9, wherein said body contact to said semiconductor layer is connected to a low voltage opposite in polarity to a voltage applied to said field effect transistor.

14. An integrated circuit as recited in claim 9, wherein said semiconductor layer is formed on an insulator on a substrate.

15. An integrated circuit as recited in claim 9, wherein said semiconductor layer is a silicon layer of a silicon-on-insulator substrate.

16. An integrated circuit as recited in claim 9, wherein said plurality of transistor portions include a complementary transistor pair.

17. An integrated circuit as recited in claim 9 wherein a thickness of said semiconductor layer is approximately 800 Å and said body control contact extends approximately 300 Å to 350 Å into said semiconductor layer.

18. A portable electronic device comprising
   a portable power supply, and
   an integrated circuit, said integrated circuit comprising
   a plurality of transistor portions comprising a source, drain and gate formed on or in a semiconductor layer of a first conductivity type,
   a body contact to said semiconductor layer, and
   a body control contact of a conductivity type opposite said first conductivity type and interposed between said gate and said body contact to function as a pass transistor gate between at least one of said transistor portions and said body contact.

19. A portable electronic device as recited in claim 18, wherein said integrated circuit further includes
   a connection between a gate a said transistor portion and said body control contact.

20. A portable electronic device as recited in claim 18, wherein said plurality of transistor portions include a complementary transistor pair.

* * * * *